United States Patent [19]
Keenan

[11] Patent Number: 5,367,167
[45] Date of Patent: * Nov. 22, 1994

[54] UNCOOLED INFRARED DETECTOR AND METHOD FOR FORMING THE SAME

[75] Inventor: William F. Keenan, Plano, Tex.

[73] Assignee: Texas Instruments Incorporated, Dallas, Tex.

[*] Notice: The portion of the term of this patent subsequent to Feb. 22, 2011 has been disclaimed.

[21] Appl. No.: 107,398

[22] Filed: Aug. 16, 1993

Related U.S. Application Data

[63] Continuation of Ser. No. 951,928, Sep. 25, 1992, Pat. No. 5,288,649, which is a continuation of Ser. No. 768,801, Sep. 30, 1991, abandoned.

[51] Int. Cl.$^5$ .............................................. H01L 31/08
[52] U.S. Cl. ........................... 250/338.4; 250/338.1; 250/349; 250/332; 250/370.08
[58] Field of Search ...................... 250/352, 338.1, 349, 250/332, 338.4, 370.06, 370.08

[56] References Cited

U.S. PATENT DOCUMENTS

| | | | |
|---|---|---|---|
| 3,801,949 | 4/1974 | Larrabee | 338/22 R |
| 4,654,622 | 3/1987 | Foss | 338/14 |
| 4,671,853 | 6/1987 | Takayama | 437/3 |
| 4,754,139 | 6/1988 | Ennulat et al. | 250/332 |
| 4,996,427 | 2/1991 | Noble et al. | 250/332 |
| 5,010,018 | 4/1991 | Polasko et al. | 437/3 |
| 5,010,251 | 4/1991 | Grinberg et al. | 250/332 |
| 5,021,663 | 6/1991 | Hornbeck | 250/349 |
| 5,059,543 | 10/1991 | Wise et al. | 437/3 |
| 5,077,474 | 12/1991 | Nix et al. | 250/332 |
| 5,100,479 | 3/1992 | Wise et al. | 437/3 |
| 5,120,664 | 6/1992 | Murotani | 437/3 |

FOREIGN PATENT DOCUMENTS

| | | |
|---|---|---|
| 0354369 | 2/1990 | European Pat. Off. |
| 63-273024 | 11/1988 | Japan |
| 2200246 | 7/1988 | United Kingdom ............... 250/349 |

OTHER PUBLICATIONS

"Thin-Film Resistance Bolometer IR Detectors", K. C. Liddiard, *Infrared Phys.*, vol. 24, No. 1, pp. 57–64, 1984.
"Thin-Film Resistance Bolometer IR Detectors-II", Liddiard, *Infrared Phys.*, vol. 26, No. 1, pp. 43–49, 1986.
"Low-Temperature Bolometer Array", M. Boninsegni et al., *Rev. Sci. Instrum.*, vol. 60, No. 4, Apr. 1989.
"Low-Temperature Operating Silicon Bolometers for Nuclear Radiation Detection", G. A. Racine et al., *Sensors and Actuators*, A21–A23 (1990) pp. 478–481.
"A Thin-Film Bolometer for Radiation Thermometry at Ambient Temperature", W. Lang et al., *Sensors and Actuators*, A21–A23 (1990) pp. 473–477.

*Primary Examiner*—Carolyn E. Fields
*Attorney, Agent, or Firm*—Ira S. Matsil; James C. Kesterson; Richard L. Donaldson

[57] ABSTRACT

A bolometer for detecting radiation in a spectral range is described herein. The bolometer includes an integrated circuit substrate 122 and a pixel body 120 spaced from the substrate 122 by at least one pillar 124. The pixel body 120 comprises an absorber material 132, such as titanium for example, for absorbing radiation in the spectral range, which may be 7 to 12 microns for example. The absorber material 132 heats the pixel body 120 to a temperature which is proportional to the absorbed radiation. An insulating material 134 is formed over the absorber material 132. In addition, a variable resistor material 136, possible amorphous silicon for example, with an electrical resistance corresponding to the temperature of the pixel body 120 is formed over said insulating layer 134. A current flows through the variable resistor material 136 substantially parallel to the integrated circuit substrate 122 for detection. Other systems and methods are also disclosed.

22 Claims, 5 Drawing Sheets

UNCOOLED INFRARED DETECTOR AND METHOD FOR FORMING THE SAME

This is a continuation of application Ser. No. 07/951,928, filed Sep. 25, 1992 (now U.S. Pat. No. 5,288,649 issued Feb. 22, 1994), which was a continuation of Ser. No. 07/768,801 filed Sep. 30, 1991, now abandoned.

FIELD OF THE INVENTION

This invention generally relates to the fabrication of semiconductor devices and specifically to an uncooled infrared detector and a method for forming the same.

BACKGROUND OF THE INVENTION

Detection of infrared radiation emitted by warm bodies provides an important method for night vision (perception without visible light). Infrared detectors may be classified in various ways, such as scanning or staring arrays, cryogenic (typically liquid nitrogen temperatures) or uncooled detectors, 3–5 micron or 8–12 micron spectral sensitivity range, and photon or thermal detection mechanism. Cryogenic infrared detectors are typically made of small bandgap (about 0.1–0.2 eV) semiconductors such as HgCdTe and operate as photodiodes or photocapacitors by photon absorption to produce electron-hole pairs. For example, see U.S. Pat. No. 4,686,373 (Tew et al) which describes a hybrid system with HgCdTe photocapacitors glued to silicon signal processing circuitry.

Uncooled infrared detectors cannot make use of small bandgap semiconductors because the bandgap is only about 4 kT at room temperature and dark current swamps any signal. Consequently, uncooled infrared detectors rely on the other physical phenomena and are less sensitive than cryogenic detectors but do not require cooling apparatus or its energy consumption. For portable, low power applications where the greater detectivity of cryogenic detectors is not needed, the preferred choice is an uncooled thermal detector: infrared photons are absorbed and the resultant heating of the absorbing element is detected. The thermal detector is usually one of three types: (1) pyroelectric detector, (2) thermocouple, or (3) bolometer.

The pyroelectric detector uses a ferroelectric ceramic material (such as $BaSrTiO_3$) at operating temperatures (typically 0° C. to 150° C.) a little below its Curie temperature. The preferred ferroelectric materials have a large change in spontaneous dielectric polarization at operating temperatures, and the heating of the ferroelectric is detected by sensing the induced voltage created by the generation of charge across a capacitor with the ferroelectric as insulator. For example, see U.S. Pat. Nos. 4,348,611 (Ruppel et al), 4,142,207 (McCormack et al), and 4,379,232 (Hopper).

The pyroelectric detector is a hybrid approach that has problems when extended to large detector arrays (such as arrays of 256 by 256 pixels) due to ferroelectric material defects, contact defects, and bump bonding defects which imply low yields.

Thermocouples rely on the change in contact potential of a junction of dissimilar conductors with temperature; see for example G. Lahiji et al, A Monolithic Thermopile Detector Fabricated Using Integrated-Circuit Technology, 1980 IEEE IEDM Tech. Dig. 676 which uses antimony bismuth or polysilicon-gold couples in monolithic arrays on silicon.

Bolometers typically rely on the temperature change of resistance of thermally isolated thin metal films or semiconductor films. The thin films may be fabricated on a suspended dielectric film in a silicon substrate and may be located adjacent to monolithic detection circuitry on the silicon substrate. The dielectric film is thermally isolated from the remainder of the silicon substrate by etching away the silicon from beneath the dielectric film so that it is suspended. See for example K. C. Liddiard, 24 Infrared Physics 57 (1984) and 26 Infrared Physics 43 (1986) which includes amorphous silicon films for resistance change with temperature plus abutting nickel films for infrared absorption and electrical contact.

Thermocouples and bolometers avoid the yield problem of the pyroelectric detectors because they can be monolithically fabricated on a silicon wafer along with the detection circuitry. However, thermocouples and bolometers have the problem of lower detectivities than pyroelectric detectors.

Another bolometer approach is described in U.S. Pat. No. 5,021,663 (Hornbeck). In this approach, current flows vertically through the detector with a relatively short resistance path which results in non-linear electrical characteristics and a larger voltage coefficient of resistance. Non-linear resistors compromise the performance of a detector array. Therefore, a cell with a large conduction path is desirable.

Accordingly, improvements which overcome any or all of the problems are presently desirable.

SUMMARY OF THE INVENTION

Other objects and advantages will be obvious, and will in part appear hereinafter and will be accomplished by the present invention which provides a method and apparatus for an uncooled infrared detector.

A bolometer for detecting radiation in a spectral range is described herein. The bolometer includes an integrated circuit substrate and a pixel body spaced from the substrate by at least one pillar. The pixel body comprises an absorber material, such as titanium for example, for absorbing radiation over a broad range including the spectral range, 7 to 12 microns for example. The absorber material heats the pixel body to a temperature which is proportional to the absorbed radiation. An insulating material is formed over the absorber material. In addition, a variable resistor material, possible amorphous silicon for example, with an electrical resistance corresponding to the temperature of the pixel body is formed over said insulating layer. A current flows through the variable resistor material substantially parallel to the integrated circuit substrate for detection.

A method of forming a bolometer cell includes the steps of forming a temporary layer on a substrate. A layer of absorber material is formed on the temporary layer and patterned and etched. An insulating layer is formed over the layer of absorber material and patterned and etched. A layer of variable resistor material is then formed over the insulating layer. At least one pillar hole is formed in the layer of variable resistor material and the underlying portion of the temporary layer. A conducting pillar is formed in each of the pillar holes. The variable resistor material is patterned and etched to form a temperature variable resistor. At least two contacts are formed from the pillars to the temperature variable resistor. Finally, the temporary layer is removed.

An advantage of the invention is that it provides a producible infrared detection cell which may be fabricated at reasonable costs relative to other presently available systems.

In addition, the cell of this invention may be operated at temperatures near room temperature and therefore there is no requirement for cryogenic equipment. As a result, the cost and size limitations normally associated with cryogenic systems are avoided.

Further, since the current path through the temperature sensitive resistor is parallel to the substrate, as opposed to vertically through the resistor, there is a relatively long conductive path. Because of this, a more reasonable voltage coefficient of resistance may be achieved and accordingly a more linear device may be built.

BRIEF DESCRIPTION OF THE DRAWINGS

The above features of the present invention will be more clearly understood from consideration of the following descriptions in connection with accompanying drawings in which.

Corresponding numerals and symbols in the different figures refer to corresponding parts unless otherwise indicated.

DETAILED DESCRIPTION OF PREFERRED EMBODIMENTS

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

Figure 1:
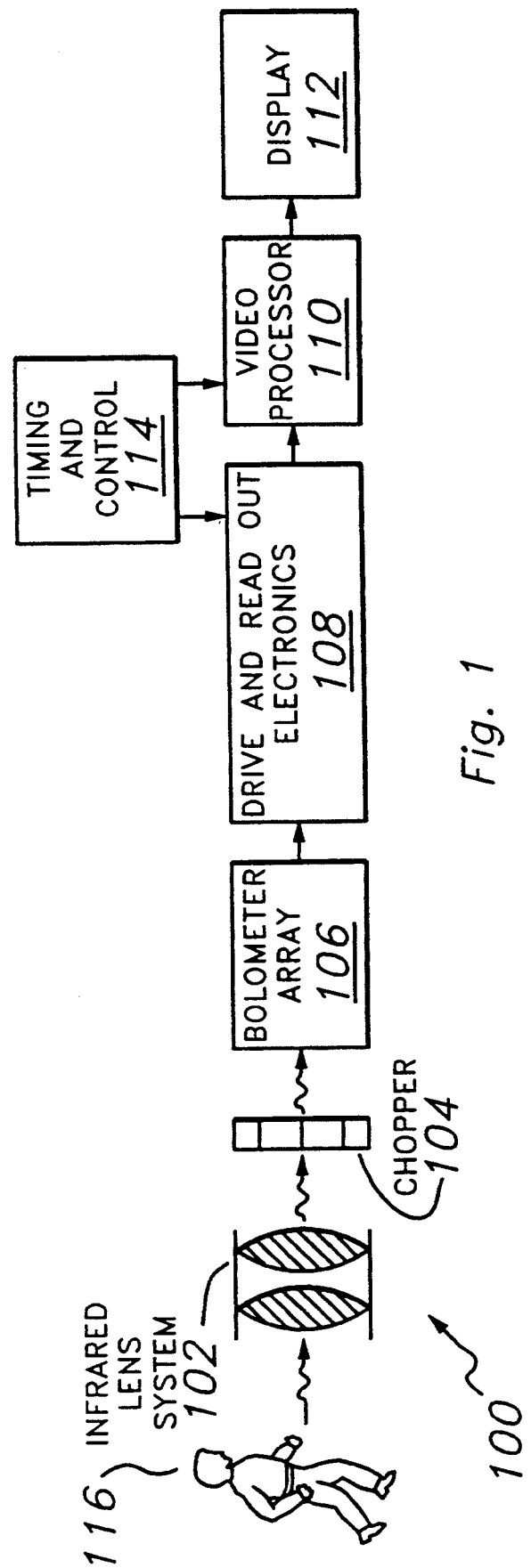
FIG. 1 shows a block diagram of an infrared detector system which includes a first preferred embodiment bolometer array.

FIG. 1 illustrates in schematic diagram view an infrared imagery system, generally noted 100, which includes infrared lens system 102, optional mechanical chopper 104 (this element is not necessary for the present invention), bolometer array 106, drive and readout electronics 108 for array 106, video processor 110, display 112, and timing and control electronics 114. The lens system 102 images infrared radiation emitted by warm object 116 onto array 106. Chopper 104 may be a rotating disk with openings that periodically block and let pass the infrared radiation collected by lens system 102. In the preferred embodiment, the chopper 104 is of the focusing/defocusing type. In one embodiment, array 106 includes 65,536 bolometers arranged in 256 rows by 256 columns; each bolometer corresponds to a pixel in the image of the warm body 116 plus surrounding scene in the field of view of the lens system 102. Array 106 may be housed in a stainless vacuum chamber with an infrared transparent window formed in one side or surrounded by an atmosphere of gate with low thermal transport. The window is positioned so that radiation from the scene with warm body 116 passes through the window onto array 106.

The design considerations for a microbolometer image sensor can be identified by considering each element in the chain of events which lead to the conversion of the IR flux to electrical signal. The first step is to convert the IR flux to heat energy stored in the detector pixel. If this process is to be as large as possible, the absorption efficiency of the pixel should be 100% over the IR band of interest. In order for the temperature rise of the pixel element to be large, the heat capacity of the pixel must be minimized and the thermal isolation of the pixel from the surrounding structure must be maximized. To maximize the signal output for a given temperature change of the pixel, the coefficient of resistance with temperature of the bolometer resistor should be large as possible. The pixel resistance value must be such as to be compatible with the readout electronics and to control the power dissipation in the pixel at the readout conditions required by the readout electronics. Finally, the electrical noise generated by both the pixel resistance and the readout pre amplifier must be sufficiently small to provide the necessary imaging performance.

As often is true in engineering structures, many of these conditions are contradictory and all of the parameters cannot be optimized individually; for example, if the thermal capacity of the pixel is minimized by thinning the detector, the absorption of the structure will probably be unacceptable, and the converse is also unacceptable, maximizing absorption at the expense of thermal capacity.

Figure 2:
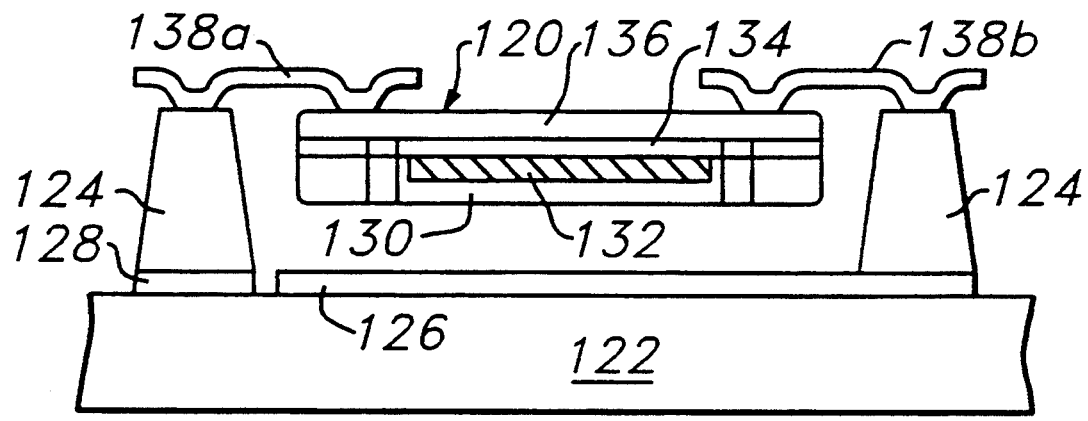
FIG. 2 shows a cross-sectional view of a preferred embodiment bolometer cell.

FIG. 2 illustrates a first preferred embodiment cross section of a structure which results in an acceptable engineering trade-off between the conflicting requirements. In this structure, the pixel body 120 is spaced above a silicon substrate 122, which contains the pixel preamplifier (not shown) associated with the particular pixel, by pillars 124. The pillars 124 may be made of aluminum or other materials which meet the structural and conductive requirements such as other metals. These pillars 124 control the separation between the pixel 120 and the substrate mirror 126 formed by an infrared reflective film deposited on the substrate 122. The reflective film may be aluminum or other appropriate metals. The mirror 126 serves to reflect the IR radiation which is not absorbed on the first path through the pixel back into the pixel for additional absorption. The pixel body 120 may ideally be spaced $\lambda/4$ microns ($\lambda$ is the wavelength of IR radiation being detected—typically between 7 and 12 microns) above the mirror 126 to gain resonant performance. In more practical cases, however, the spacing is determined by processing or other concerns. Experimentation has shown that IR absorbtion of this structure is not strongly dependent on the mirror to absorber spacing about $\lambda/4$ so the spacing is usually selected to facilitate fabrication.

The mirror 126 may also serve as one of the pixel interconnects between the integrated circuit (IC) and the pixel resistor. A conductive pad 128 serves as the other interconnect between the pixel and the IC. If the mirror 126 is not one of the pixel interconnects, an additional pad (not shown) may be used. It should be noted that if the first pass IR absorbtion efficiency is high enough, the mirror 126 may be omitted.

The pixel body 120 is composed of sequential layers of films which perform various functions needed for detection. The first film layer 130 is a passivation layer which protects the primary absorber layer 132 from damage during the fabrication process. Any film with the required chemical properties can be used. Exemplary films include silicon dioxide, amorphous silicon and silicon nitride. The next layer, the absorber layer 132, is a thin conductive layer which uses free electron absorption to convert the incident IR to heat in the pixel. This absorber layer is typically a metal such as titanium, nickel or chromium. Next, an insulating layer 134 is formed to isolate the absorber layer 132, a conductor, from the next layer, the temperature sensitive resistive film 136 of the detector. This insulating film 134 may also serve as a secondary absorber of the IR radiation. Any insulating film may be used for insulating layer 134, for example silicon dioxide, silicon nitride or amorphous silicon. The layer 134 may be the same material as passivation layer 130. The final film is the temperature sensitive resistive layer 136 which forms the bolometer resistor and may serve as a secondary IR absorber. In a preferred embodiment, the bolometer resistor material 136 may be amorphous silicon doped to $7 \times 10^{-4}/\Omega-cm$. However, any semiconductor or semimetal with an appropriate TCR (temperature coefficient of resistance) can be used.

An ideal bolometer has four characteristics, namely 1) large temperature dependence, 2) 100% IR absorption, 3) minimal thermal mass, and 4) high thermal isolation. Therefore, the materials chosen to form the device are chosen to optimize these characteristics. For example, the absorption layer 132 is chosen such that the maximum amount of IR energy is converted to heat. In practical cases, with materials such as titanium, 80 to 90% absorption has been achieved.

If the variable resistor is formed of an appropriate semiconductor, the spectral range can include visible light. The visible light is absorbed by the semiconductor resulting in carrier generation in the bolometer resistor. This changes the detector resistance.

Once the IR energy is converted to heat, the temperature sensitive resistance material 136 must change resistance such that the heat, and therefore the IR radiation, can be detected in the circuit below. In addition, the electrical noise generated in the resistor must be minimized. Typically noise is 1/F noise. 1/F noise is typically generated by carrier trapping in film defects. Preparation of low noise films is currently an empirical art. Therefore, materials which maximize thermal resistance dependence but minimize electrical noise are chosen. Some examples are amorphous silicon, germanium, and metal oxides. But other materials which meet these criteria may also be used.

The third characteristic, minimal thermal mass, is optimized by choosing films with appropriate physical strength so that each of the films may be made very thin.

The fourth characteristic, high thermal isolation is optimized by thermally isolating the pixel from the remainder of the cell. This goal is accomplished by spacing the pixel body 120 from the substrate 122. Other thermal isolation strategies will be discussed below with reference to FIG. 3.

The temperature sensitive resistor 120 is connected to the pillar 124, which is in turn connected to the IC formed in the substrate 122, through interconnects 138a and 138b. The interconnects 138a and 138b may be formed by any suitable conductive material.

Figure 3:
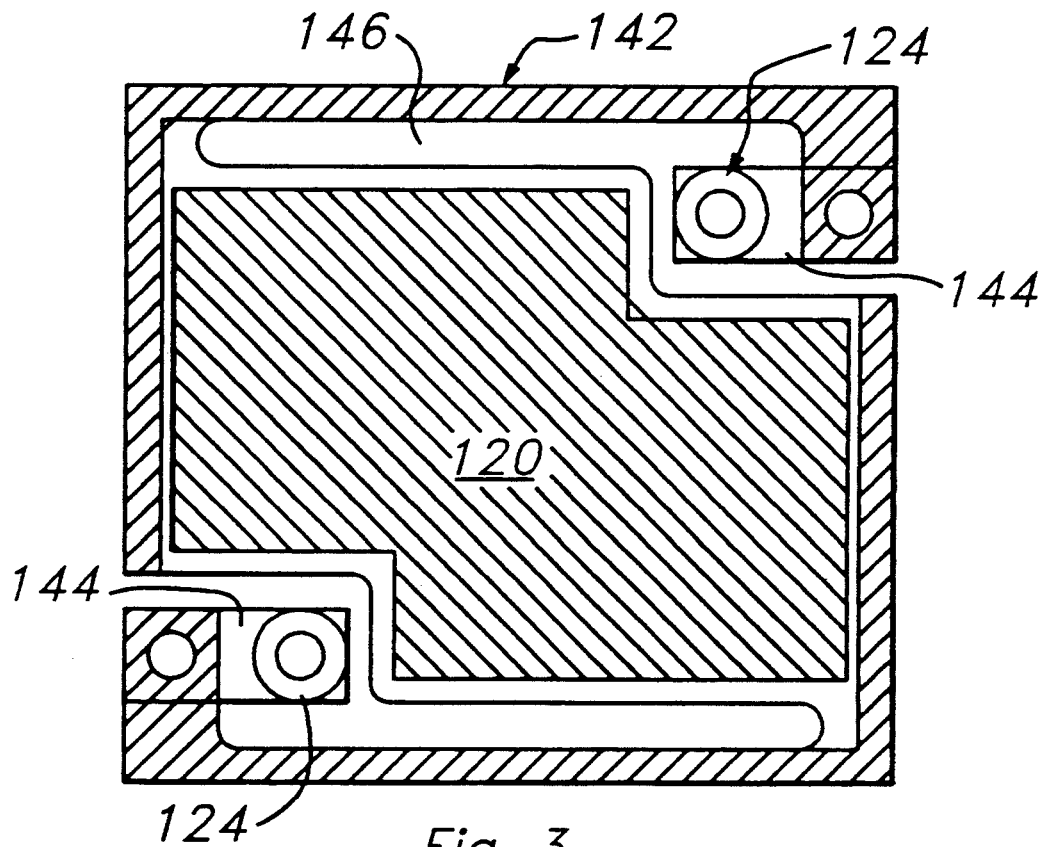
FIG. 3 shows a top-view of a preferred embodiment bolometer cell.

FIG. 3 shows the plan view of the pixel structure. Referring now to FIG. 3 along with FIG. 2, the central portion of the pixel 120 provides both the absorption of IR radiation and the body of the pixel resistor. The support arms 142 along two edges of the pixel provide long, thin, narrow thermal isolation resistors between the resistor body 120 and the underlying spacer pillars 124 located at the substrate ends of these thermal resistors 142. The support arms are spaced from the resistor body by air gaps 146. In this way, the pixel body 140 is thermally isolated from the substrate 122.

As illustrated in FIG. 3, a trade-off must be made between the thermal isolation of the pixel and the structural support of the pixel body. In the case illustrated, gaps 146 (which may be air gaps) separate the support arms 142 from the pixel body 120 on three of the four sides. The gaps 146 can be extended along the remaining two sides of the pixel body if additional thermal isolation is desired. The mechanical strength of the support arms 142 will be substantially weakened by this change. For each individual design, this trade-off must be considered.

Along the top surface of the support arms 142 a very thin film of a conductive material may be applied to provide electrical contacts to the resistor body 120 located in the center of the pixel. This film is as thin as possible in order to avoid compromising the thermal isolation of the pixel.

The metal tabs 144 shown in FIG. 3 provide mechanical support and electrical contacts between the ends of the support arms 142 and the tops of the spacer pillars 124. The contact regions shown are an artifact of the fabrication process and do not make a direct contribution to the structure.

Figure 4A:
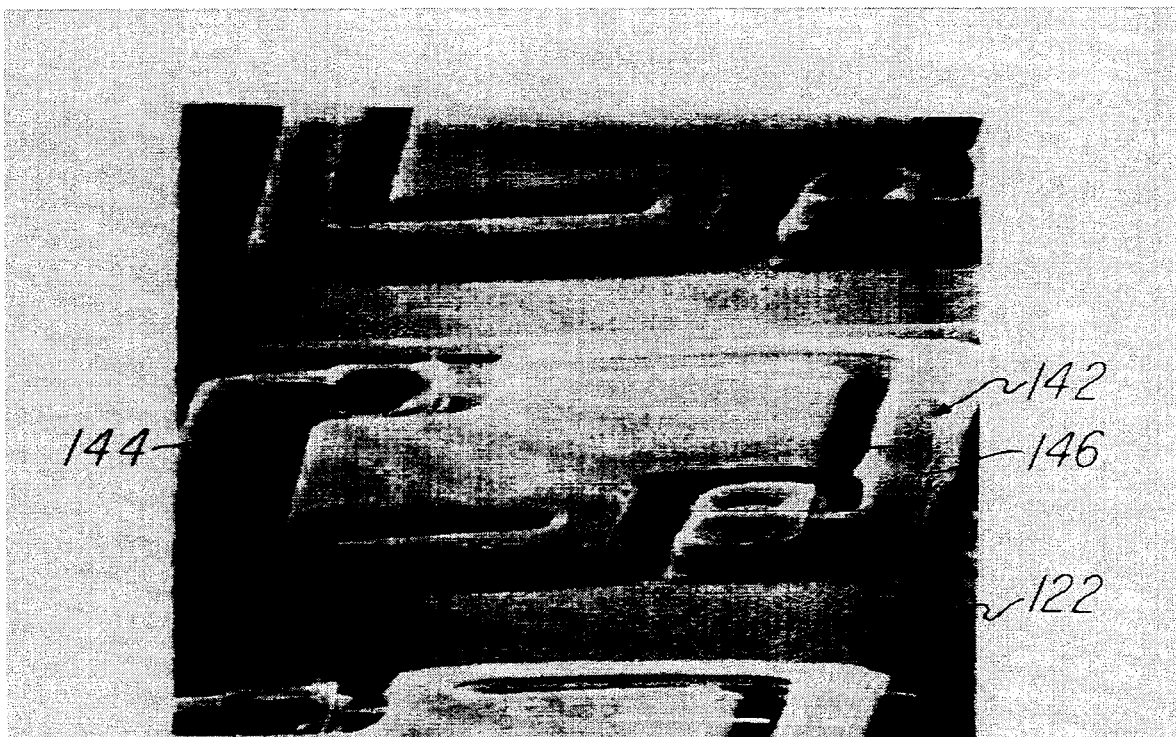
FIGS. 4a-4b are microphotographs of a infrared detector.
Figure 4B:
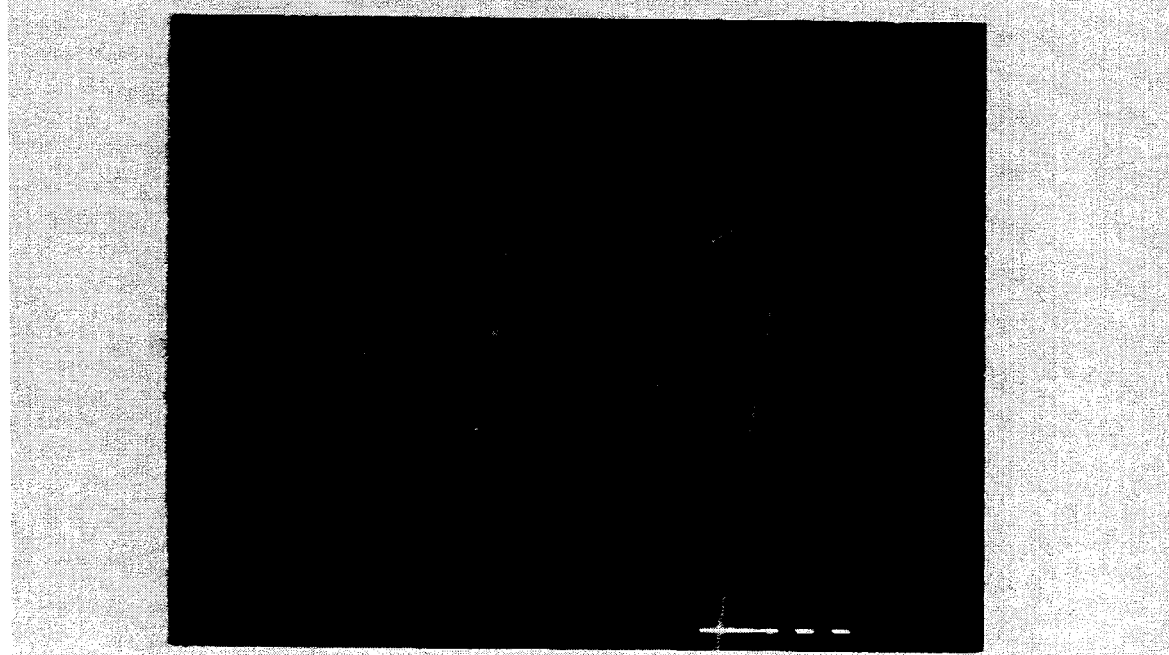

A SEM (secondary electron microscope) photomicrograph of a completed pixel is illustrated in FIG. 4a. FIG. 4b shows an array of mechanical pixels to demonstrate the fabrication process on closely packed arrays.

Individual pixels fabricated to the cross section in FIG. 2 and having plan form geometries such as in FIG. 3 have been fabricated and operated as IR detectors using external amplifiers. The NEΔT (Noise Equivalent Differential Temperature) measured to date for these devices, assuming an f/1 optics system, has been as low as 0.18° C. when measured over the IR bandpass from 7 to 12 microns and an electrical bandpass of 1 to 100 Hz. The current limiting factor of the system performance is excess noise (typically 1/F noise) in the bolometer film. The reduction of this excess noise can, in principle, be lowered such that the system performance can reach between 0.1° and 0.05° C. or better.

The current execution of these pixel designs uses an absorber passivation layer 130 of $SiO_2$ (silicon dioxide) deposited by plasma CVD (chemical vapor deposition) with a thickness of about 250 Å. The absorber layer 132 is composed of 140 Å of Ti (titanium) deposited over the passivation layer 130. The insulator layer 134 is also formed of a plasma deposition $SiO_2$ with a thickness varying between 1000 and 2000 Å. The resistive layer 136 is composed of a-Si (amorphous silicon) deposited by plasma CVD and doped for electrical conduction with phosphorous derived from $PF_5$ (phosphorous pentafluoride) feed stock. The temperature coefficient of resistance of this film as presently deposited is 3 to 3.5% and the conductivity is approximately $8 \times 10^{-4}$ cm$^{-1}$ $\Omega^{-1}$.

The selection of these films for the pixel structure is partly based on process convenience and partly based on critical electrical and mechanical considerations. For example, the insulator film could be silicon nitride, zinc sulfide, or amorphous silicon, rather than silicon dioxide. Table 1 summarizes some of the more important of these electrical and mechanical properties.

A simplified description of a single pixel operation follows. Infrared radiation impinges upon the top surface of the pixel body 120 and is absorbed in the absorbing layer 132 causing the pixel temperature to rise. The resistance of the temperature sensitive resistive layer 136 then changes in correspondence with the temperature change, i.e., in correspondence with the change in intensity of the IR radiation. This change in resistance can be monitored by the integrated circuitry formed in the substrate 122.

It should be noted that in the embodiment illustrated in FIG. 2, the current flows from interconnect 138a through resistive layer 136 in parallel with the substrate 122 and down through interconnect 138b. Since the current flows laterally across the pixel, as opposed by vertically into and then out of the pixel, the conduction path is considerably longer than some prior art applications. This difference, possibly from 3000 Å to 30 $\mu$ (2 orders of magnitude), gives a considerable improvement in the voltage coefficient of resistance and therefore gives a very linear resistor.

Figure 5:
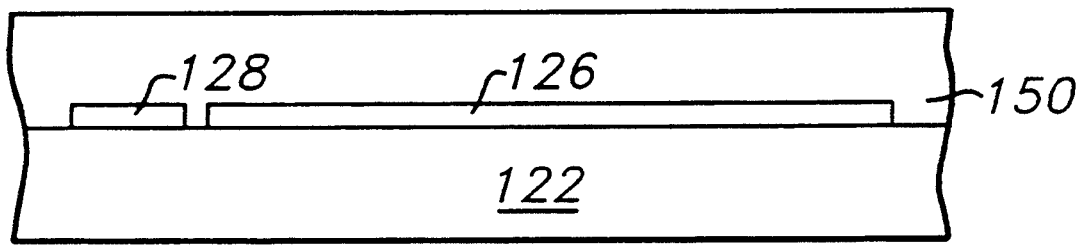
FIGS. 5-10 are cross-sectional views to aid in the understanding of an exemplary fabrication process.

The major process steps of a current fabrication process embodiment are illustrated in the cross-sectional views of FIGS. 5-10. Referring first to FIG. 5, on the planarized surface of an IC designed for this application a film of aluminum is deposited and patterned to reveal the electrical contacts 126 and 128 to the circuit, Next a film 150 of polyimide (organic polymer) is deposited to a thickness of 2 $\mu$m by conventional spin coating often used for this material. The film 150 is subsequently baked to insure stability at elevated temperatures.

Figure 6:
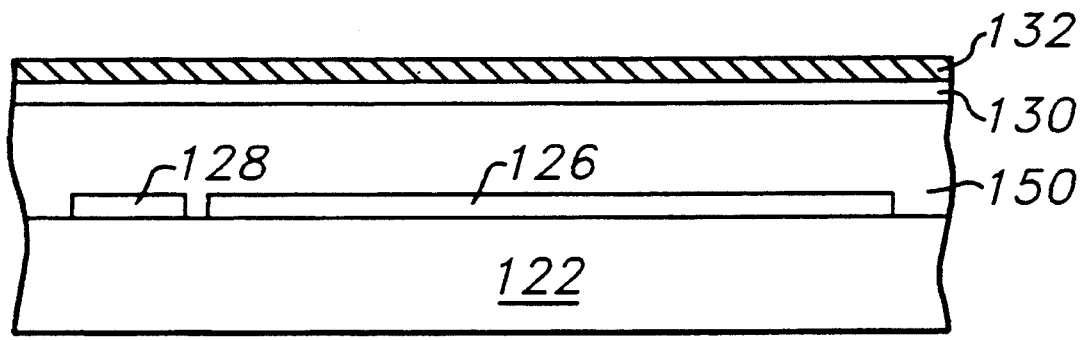
Figure 7:
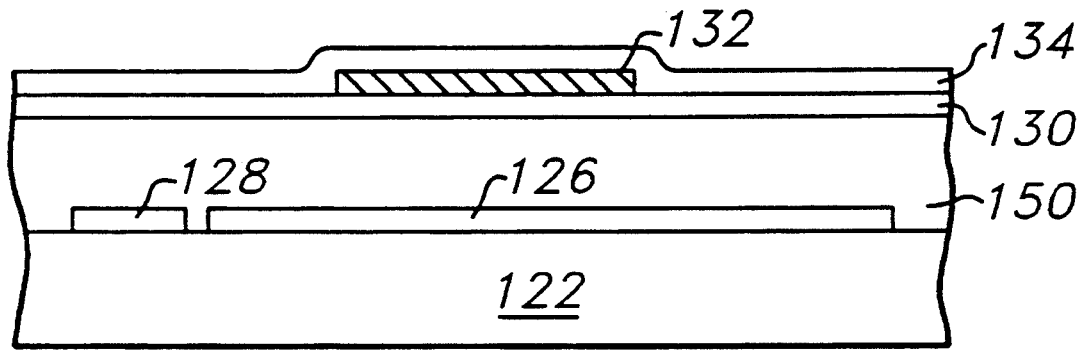

Referring next to FIG. 6, over the surface of polyimide film 150, the absorber passivation film (currently SiO$_2$) is applied by plasma CVD, typically a substrate temperature of 175° C. Following the passivation film 130, the Ti absorber film 132 is deposited by DC magnetron sputtering. Following deposition, the Ti film 132 is patterned in the shape of the body of the pixel resistor, without the support arms, by plasma etching in a mixture of BCl$_3$ (boron trichloride) and other gases as illustrated in FIG. 7.

The insulator film 134 of SiO$_2$ is now applied using plasma CVD to a thickness between 1000 and 2000 Å thick. This film and the underlying passivation film, now referred to as layer 135 in FIGS. 7-10, are patterned and plasma etched at one time using CF$_4$ (carbon tetrafluoride) and O$_2$ (oxygen) or other known SiO$_2$ etchants. This pattern includes both the central body of the pixel and the support arms.

Figure 8:
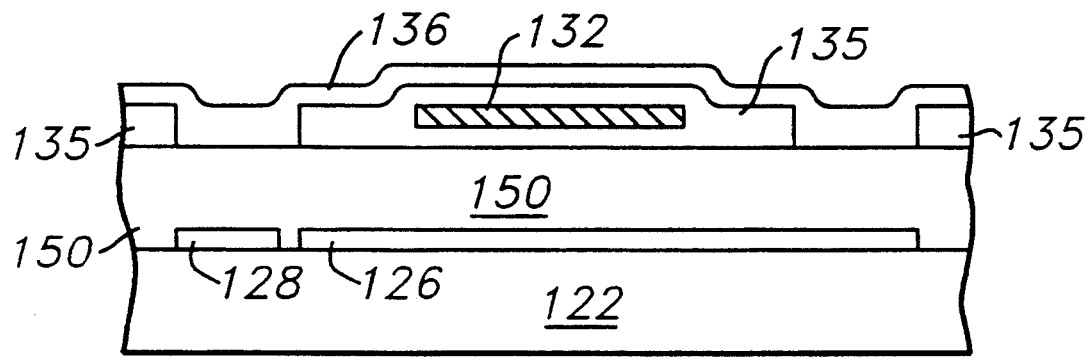
Figure 9:
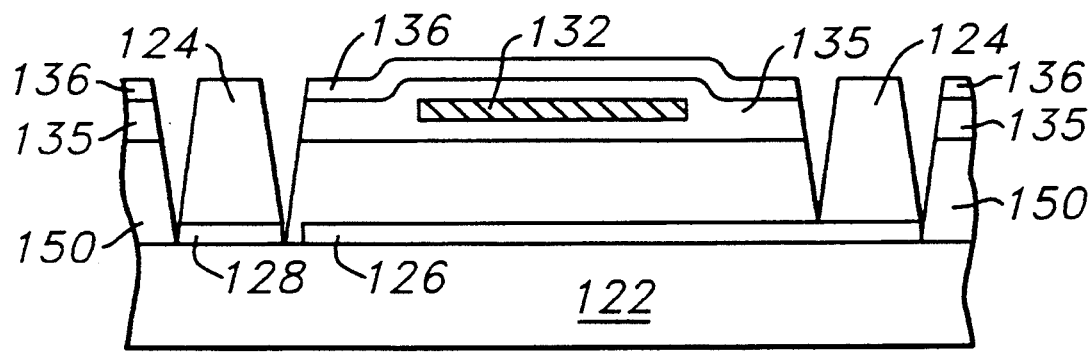

Referring now to FIG. 8, over this patterned insulating layer the n or p doped, a-Si (amorphous silicon) film 136 is deposited by plasma CVD using SiH$_4$ (silane) and PF$_5$ (phosphorous pentafluoride (boron fluoride may also be used) as feedstocks. The parameters of this deposition are chosen to provide the electrical and physical characteristics desired. Referring next to FIG. 9, the a-Si film 136 is selectively removed where needed to expose the underlying polyimide film 150 at the pillar locations. The polyimide is then removed down to the underlying metal contacts 126 or 128 of the IC formed in the substrate 122 using a plasma of oxygen and argon. The patterned a-Si film 136 is used as an etch mask during this etch step.

The temperature sensitive a-Si film 136 is again patterned, this time in the outline of both the pixel body and the support arms by using photoresist processing and plasma etching in carbon tetrafluoride and oxygen.

The structure is now re-coated with photoresist (not shown) in the negative of the pillar pattern and the aluminum pillars 124 are deposited by vacuum metalization to the 2.0 micron thickness of the polyimide film. The excess metal is then stripped from the structure using a specially developed lift-off process leaving the pillars 124 nested in holes in the polyimide film 150 and contacting the IC.

The electrical boundary of the resistor body is now defined by a thin (100 Å or less) film of a conductor deposited and patterned as shown in FIG. 3. This film serves to provide low resistance contacts to the resistor body in the center of the pixel.

Figure 10:
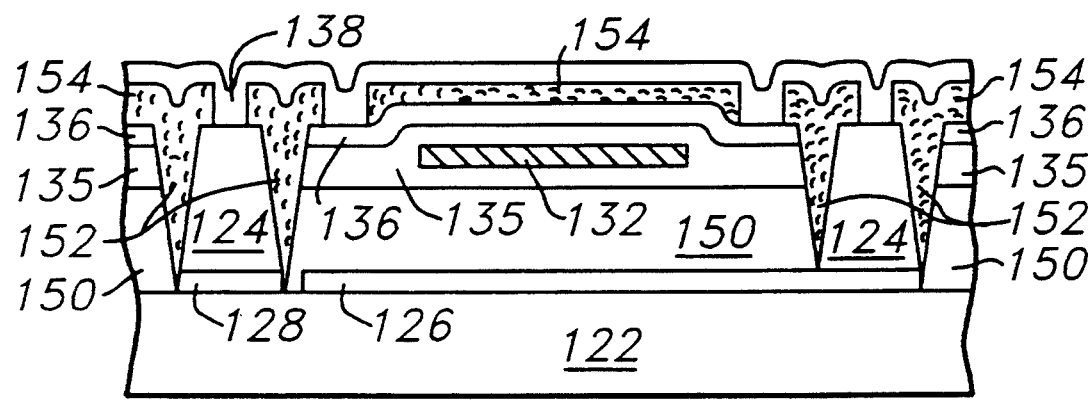

Referring now to FIG. 10, the final element of the structure, the tab metalization is now applied by using two layers of photoresist. The first layer 152 is to fill the void between the polyimide 150 edges and the body of the pillars 124 and the second layer 154 is to define the tab pattern proper. The tab metal 138 is deposited over these photoresist films and the excess metal is removed by conventional lift-off processes. This completes the structure as shown in FIG. 2 except for removing the underlying polyimide film 150.

Since the free standing pixel elements may be damaged by immersion in chemicals, the substrate wafer may be sawed into individual arrays and the wafers cleaned by the usual chemical means before the polyimide film is removed from under the pixel. With the sawing and post saw cleanup complete, the underlying polyimide film is etched from under the pixel using a plasma of oxygen and argon. Typical etch times are currently about 3 to 5 hours using a substrate temperature of 150° C.

The parameters of the structure just described may be further optimized. Further, the arrangement of the films in the structure may well be revised in order to simplify the fabrication procedure or to improve performance. For example, inverting this structure will allow the pixel body to be defined by a single patterning step and insure registration of the insulator and resistor films.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

TABLE 1

| Element | Electrical | Physical |
| --- | --- | --- |
| Mirror (126) | Conductor | Adhesion to IC |
| | | IR reflector |
| | | Chemically inert |
| Passivation (130) | Insulator or conductor | Adhesion |
| | | Acceptable CTE |
| | | Etch resistant |
| | | Appropriate Internal stresses |
| Absorber (132) | Conductor with appropriate conductivity | Adhesion |
| | | Acceptable CTE |
| | | Absorption band |
| | | Appropriate Internal stresses |
| Insulator (134) | Insulator | Adhesion |
| | | Appropriate Internal stresses |
| | | Acceptable CTE |

TABLE 1-continued

| Element | Electrical | Physical |
|---|---|---|
| Resistive (136) | Semiconductor w/ proper TCR, Noise, and Conductivity | Adhesion Appropriate Internal stresses |
| Electrode (138) | Conductor Ohmic contact to Semiconductor | Adhesion Appropriate Internal stresses |
| Tab (138) | Conductor | Adhesion Strength Appropriate Internal stresses |
| Pillar (124) | Conductor | Adhesion Strength |

What is claimed is:

1. A bolometer for detecting radiation in a spectral range comprising:
    an integrated circuit substrate; and
    a pixel body spaced from said substrate by at least one pillar, said pixel body comprising:
        an absorber material for absorbing radiation in said spectral range, said absorber material heating said pixel body to a temperature in proportion to the absorbed radiation;
        an insulating material formed over said absorber material; and
        a variable resistor material with an electrical resistance corresponding to the temperature of said pixel body, said variable resistor material formed over said insulating material.

2. The bolometer of claim 1 wherein said spectral range is between 7 and 12 microns.

3. The bolometer of claim 1 wherein said pixel body is spaced between about 2 and 3 microns from said integrated circuit substrate.

4. The bolometer of claim 1 and further comprising a passivation layer formed beneath said absorber material.

5. The bolometer of claim 4 wherein said passivation layer comprises silicon oxide.

6. The bolometer of claim 1 wherein said absorber material is titanium.

7. The bolometer of claim 1 wherein said variable resistor material is amorphous silicon.

8. The bolometer of claim 1 wherein said insulating material comprises amorphous silicon.

9. The bolometer of claim 1 wherein said insulating material comprises silicon dioxide.

10. The bolometer of claim 9 wherein said passivation layer comprises silicon dioxide.

11. The bolometer of claim 1 wherein said insulating material comprises silicon nitride.

12. The bolometer of claim 1 and further comprising a mirror region formed on said substrate beneath said pixel body.

13. The bolometer of claim 12 wherein said mirror region comprises aluminum.

14. The bolometer of claim 1 wherein said variable resistor includes a resistor path region, said resistor path region substantially parallel to said integrated circuit substrate.

15. An infrared detection array comprising:
    an array of bolometers, each of said bolometers comprising:
        an integrated circuit substrate; and
        a pixel body spaced from said substrate by at least one pillar, said pixel body comprising:
            an absorber material for absorbing radiation in a selected spectral range, said absorber material heating said pixel body to a temperature in proportion to the absorbed radiation;
            an insulating material formed over said absorber material; and
            a variable resistor material with an electrical resistance corresponding to the temperature of said pixel body, said variable resistor material formed over said insulating material; and
        circuitry formed in said substrate for detecting changes in said resistance of said variable resistor material.

16. The array of claim 15 wherein said spectral range is between about 7 and 12 microns.

17. The array of claim 15 wherein said absorber material is titanium.

18. The array of claim 15 wherein said variable resistor material is amorphous silicon.

19. The array of claim 15 wherein said insulating material comprises amorphous silicon.

20. The array of claim 15 wherein each of said bolometers further comprise a passivation layer formed beneath said absorber material.

21. The array of claim 20 wherein said passivation layer comprises silicon dioxide.

22. The array of claim 15 wherein said variable resistor includes a resistor path region, said resistor path region substantially parallel to said integrated circuit substrate.

* * * * *